United States Patent
Song

(10) Patent No.: US 9,627,020 B1
(45) Date of Patent: Apr. 18, 2017

(54) SEMICONDUCTOR DEVICE

(71) Applicant: SK hynix Inc., Icheon-si, Gyeonggi-do (KR)

(72) Inventor: Ho Uk Song, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/165,238

(22) Filed: May 26, 2016

(30) Foreign Application Priority Data

Dec. 24, 2015 (KR) .......................... 10-2015-0185926

(51) Int. Cl.
| G11C 7/14 | (2006.01) |
| G11C 7/08 | (2006.01) |
| G11C 5/14 | (2006.01) |
| G11C 11/4099 | (2006.01) |
| G11C 8/08 | (2006.01) |
| G11C 8/10 | (2006.01) |
| G11C 11/4074 | (2006.01) |

(52) U.S. Cl.
CPC .................. G11C 8/08 (2013.01); G11C 8/10 (2013.01); *G11C 5/147* (2013.01); *G11C 7/08* (2013.01); *G11C 7/14* (2013.01); *G11C 11/4074* (2013.01); *G11C 11/4099* (2013.01)

(58) Field of Classification Search
CPC ......... G11C 7/14; G11C 7/08; G11C 11/4099; G11C 5/147; G11C 11/4074; G11C 13/0038
USPC .......................................... 365/210.1, 189.09
See application file for complete search history.

(56) References Cited

U.S. PATENT DOCUMENTS

| 4,716,313 | A | * | 12/1987 | Hori | ............... | H03K 19/018507 |
| | | | | | | 326/80 |
| 5,237,533 | A | * | 8/1993 | Papaliolios | ............ | G11C 7/062 |
| | | | | | | 257/227 |
| 5,959,922 | A | * | 9/1999 | Jung | ........................ | G11C 11/22 |
| | | | | | | 365/145 |
| 8,146,036 | B1 | * | 3/2012 | Ren | ..................... | G01R 31/2894 |
| | | | | | | 716/110 |
| 2002/0031003 | A1 | * | 3/2002 | Hoya | ....................... | G11C 11/22 |
| | | | | | | 365/143 |
| 2004/0032243 | A1 | * | 2/2004 | Ganivet | ................... | G05F 3/262 |
| | | | | | | 323/316 |
| 2004/0178844 | A1 | * | 9/2004 | Kuramori | ............... | G05F 3/242 |
| | | | | | | 327/543 |
| 2005/0018470 | A1 | * | 1/2005 | Jung | ........................ | G11C 7/062 |
| | | | | | | 365/149 |
| 2006/0215471 | A1 | * | 9/2006 | Tran | ........................ | G11C 7/062 |
| | | | | | | 365/205 |

(Continued)

FOREIGN PATENT DOCUMENTS

KR 1020140002183 A 1/2014

*Primary Examiner* — Ly D Pham
(74) *Attorney, Agent, or Firm* — William Park & Associates Ltd.

(57) ABSTRACT

A semiconductor device may be provided. The semiconductor device may include a reference mat including a reference bit line and a reference word line, the reference mat, located adjacent to a normal mat, and the reference mat configured such that a capacitance of the reference bit line is adjusted based on a signal of the reference word line. The semiconductor device may include a drive controller configured to drive the signal of the reference word line with a drive voltage based on a boosting voltage, the drive voltage having a lower voltage level than the boosting voltage.

18 Claims, 6 Drawing Sheets

(56) References Cited

U.S. PATENT DOCUMENTS

| | | | | |
|---|---|---|---|---|
| 2008/0303504 A1* | 12/2008 | Kang | ....................... | G05F 3/30 |
| | | | | 323/313 |
| 2009/0153214 A1* | 6/2009 | Takatori | ............... | H03H 11/265 |
| | | | | 327/262 |
| 2012/0218835 A1* | 8/2012 | Yun | ....................... | G11C 29/24 |
| | | | | 365/189.11 |
| 2015/0155054 A1 | 6/2015 | Lee et al. | | |

* cited by examiner

SEMICONDUCTOR DEVICE

CROSS-REFERENCE TO RELATED APPLICATION

This application claims priority based upon Korean patent application No. 10-2015-0185926, filed on Dec. 24, 2015, the disclosure of which is hereby incorporated in its entirety by reference herein.

BACKGROUND

1. Technical Field

Embodiments of the present disclosure may generally relate to a semiconductor device, and more particularly to a technology regarding cell reliability of a semiconductor memory device.

2. Related Art

A semiconductor memory device is a memory device capable of storing data therein and reading the stored data.

Semiconductor memory devices are generally classified into a Random Access Memory (RAM) and a Read Only Memory (ROM). Data stored in the RAM is lost when the power supply is no longer supplied, and a memory configured to store the above-mentioned data therein is referred to as a volatile memory. Data stored in the ROM is not lost even when the power supply is no longer supplied, and a memory capable of storing the above-mentioned data is referred to as a non-volatile memory.

Generally, semiconductor memory devices are classified into a volatile memory device and a non-volatile memory device according to whether or not data is retained when a power source is cut off.

The semiconductor memory device such as a DRAM from among volatile memory devices includes a bit line sense amplifier. After a memory cell accesses the bit line sense amplifier, charge sharing between the memory cell and the bit line is achieved in the bit line sense amplifier. As a result, a small signal difference generated in the bit line is first amplified, such that the bit line sense amplifier is of importance to the semiconductor memory device.

Generally, a bit line structure of the semiconductor memory device is classified into an open bit line structure and a folded bit line structure.

The semiconductor memory device having the open bit line structure includes a bit line extending from the bit line sense amplifier and a complementary bit line (or an inverted bit line) extending opposite to the bit line sense amplifier.

The semiconductor memory device having the folded bit line structure includes a bit line and a complementary bit line which extend from the bit line sense amplifier. In this case, the bit line and the complementary bit line may construct a pair of bit lines. The open bit line structured semiconductor memory device includes many more memory cells than the folded bit line structured semiconductor memory device. Therefore, the open bit line structured semiconductor memory devices have recently been widely used throughout the world.

Operations of the semiconductor memory device will hereinafter be described.

A row strobe signal (/RAS) signal acting as a main signal for operating the DRAM device is activated to a low level, so that at least one row address signal is input to a row address buffer. In this case, a row decoding operation for selecting one of word lines contained in the cell array is carried out by decoding the row address signals.

In this case, the data of cells coupled to the selected word line is applied to the pair of bit lines (BL, /BL) composed of a bit line and its complementary bit line. As a result, a sense-amplifier (also called a sense-amp) enable signal indicating an operation start time of a sense amplifier is enabled to drive a sense-amp driving circuit of a cell block selected by the row address signals.

After that, sense-amp bias potentials are transitioned to a core potential (Vcore) and a ground potential (Vss) by the sense-amp driving circuit, so that the sense amplifier is driven. If the sense amplifier starts operation, voltages of the bit lines (BL, /BL) that have maintained a slight potential difference therebetween are transitioned to have a high potential different therebetween.

Thereafter, a column decoder turns on a column transfer transistor that transfers data from each bit line to data bus lines in response to column address signals, such that data stored in the pair of bit lines (BL, /BL) is output to the outside of the semiconductor memory device through the data bus lines (DB, /DB).

SUMMARY

In accordance with an embodiment of the present disclosure, a semiconductor device may be provided. The semiconductor device may include may include a reference mat including a reference bit line and a reference word line, the reference mat, located adjacent to a normal mat, and the reference mat configured such that a capacitance of the reference bit line is adjusted based on a signal of the reference word line. The semiconductor device may include a drive controller configured to drive the signal of the reference word line with a drive voltage based on a boosting voltage, the drive voltage having a lower voltage level than the boosting voltage.

In accordance with an embodiment of the present disclosure, a semiconductor device may be provided. The semiconductor device may include a normal mat configured to include a plurality of normal cells formed at an intersection region of a word line and a bit line. The semiconductor device may include a reference mat including a reference bit line and a reference word line, the reference mat, located adjacent to the normal mat, and the reference mat configured such that a capacitance of the reference bit line is adjusted based on a signal of the reference word line. The semiconductor device may include a sense amplifier configured to sense and amplify signals of the bit line and the reference bit line. The semiconductor device may include a drive controller configured to drive the signal of the reference word line with a drive voltage based on a boosting voltage, the drive voltage having a lower voltage level than the boosting voltage.

DETAILED DESCRIPTION

Various embodiments of the present disclosure may be directed to providing a semiconductor device that substantially obviates one or more problems due to limitations and disadvantages of the related art.

An embodiment of the present disclosure may relate to a technology for improving reliability of memory cells by controlling a drive voltage of a driver configured to control a reference mat.

Reference will now be made to the embodiments of the present disclosure, examples of which are illustrated in the accompanying drawings. Wherever possible, the same reference numbers will be used throughout the drawings to refer to the same or like parts.

Figure 1:
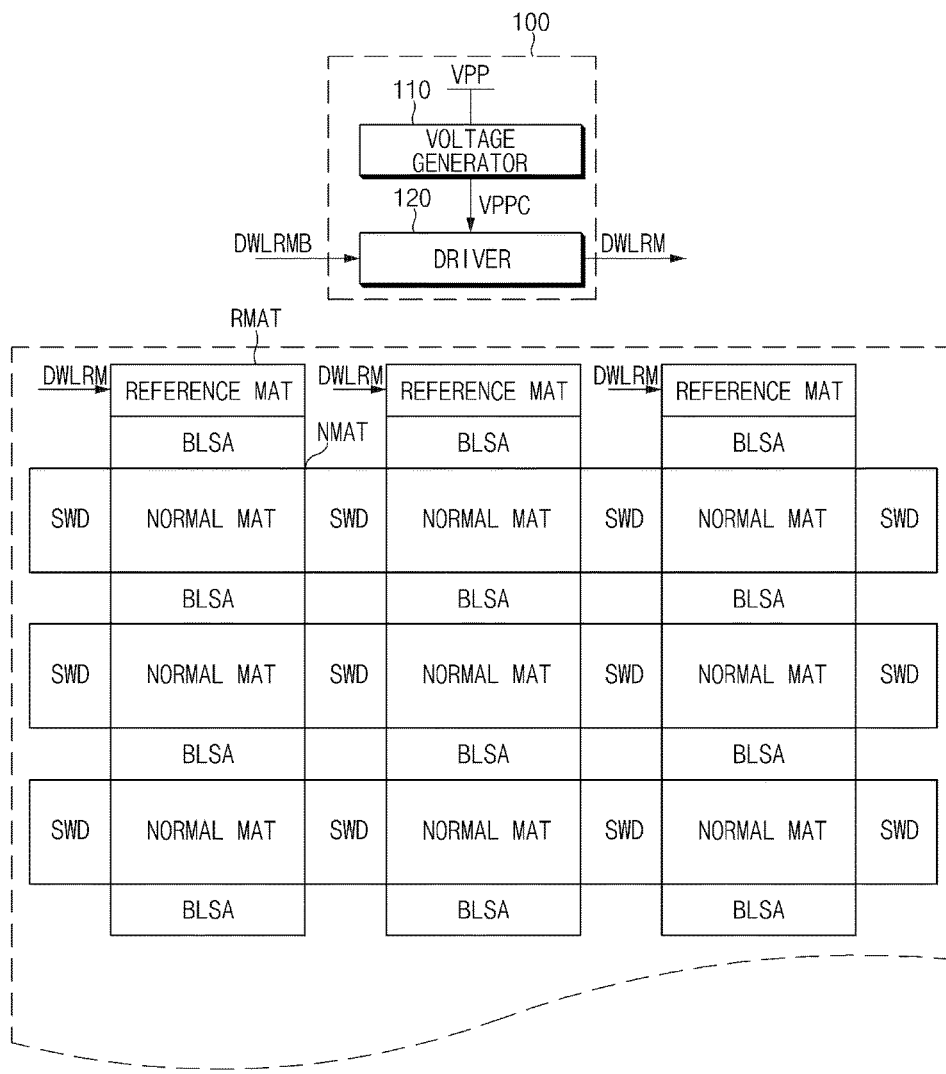
FIG. 1 is a block diagram illustrating a representation of an example of a semiconductor device according to an embodiment of the present disclosure.

FIG. 1 is a block diagram illustrating a representation of an example of a semiconductor device according to an embodiment of the present disclosure.

Referring to FIG. 1, a semiconductor device according to an embodiment may include a plurality of normal mats (NMAT), a plurality of sense-amplifiers (BLSA), a plurality of word-line drivers (SWD), a plurality of reference mats (RMAT), and a drive controller 100.

The smallest unit indicating a set (or an aggregate) of the cells of the semiconductor memory device is referred to as a memory cell array. The memory cell array may include a plurality of word lines spaced apart from each other by a predetermined distance in a first direction, and a plurality of bit lines spaced apart from each other by a predetermined distance in a second direction perpendicular to or substantially perpendicular to the first direction.

When constructing the memory cell array, valid normal mats (NMAT) to be used for the actual data Read/Write (R/W) operation are arranged, and reference mats (RMAT) are then located outside the valid normal mats (NMAT). The reference mats (RMAT) may be arranged in a peripheral region of the normal mats (NMAT).

For example, the normal mats (NMAT) may be arranged in row and column directions. The corresponding mat may be selected from among the normal mats (NMAT) by activation of a mat selection signal (not illustrated). The reference mats (RMAT) may be arranged in an upper edge region of the normal mats (NMAT).

In this case, each of the reference mats (RMAT) may be implemented to have a smaller size than a dummy mat. The reference mats (RMAT) may be arranged at the uppermost or lowermost portion of the memory cell block. In other words, the reference mats (RMAT) may be located outside the memory cell block. The reference mats (RMAT) may be located adjacent to the normal mats (NMAT).

For example, the reference mats (RMAT) may be arranged at the upper end of a target normal mat. The reference mats (RMAT) may provide a level of a complementary bit line to be compared with the target normal mat, resulting in an increased number of net dies.

The above-mentioned reference mats (RMAT) may be applied to the open bit line structured semiconductor memory device. For example, the reference mats (RMAT) including no data may be arranged in the peripheral region of the normal mats (NMAT).

Each reference mat (RMAT) may output a reference signal to a sense amplifier (BLSA) coupled thereto. The sense amplifier (BLSA) may normally sense and amplify the signal received from each normal mat (NMAT).

The plurality of sense amplifiers (BLSA) may be arranged between the plurality of normal mats (NMAT). For example, the plurality of sense amplifiers (BLSA) having an open bit line structure may sense data received from the reference mat (RMAT) and the normal mat (NMAT), amplify the sensed data, and then sense the amplified data. For example, the respective sense amplifiers (BLSA) may include a plurality of open bit line sense amplifiers.

Assuming that any one of the sense amplifiers (BLSA) is disposed between the reference mat (RMAT) and the normal mat (NMAT), a voltage difference between bit lines of the reference mat (RMAT) is compared with a voltage difference between bit lines of the normal mat (NMAT), and the comparison result may then be amplified.

The plurality of word line drivers (SWD) may select the corresponding cell by driving word lines of the plurality of normal mats (NMAT). The plurality of word line drivers (SWD) may be disposed between the plurality of normal mats (NMAT).

The drive controller 100 may select a reference cell by applying a drive voltage to a reference word line (DWLRM) of the reference mat (RMAT). The drive controller 100 may include a voltage generator 110 and a driver 120.

In this case, the voltage generator 110 may generate a drive voltage (VPPC) in response to a high voltage (VPP) (e.g., a boosting voltage VPP), and provide the drive voltage (VPPC) to the driver 120. The drive voltage (VPPC) may be lower in level than the high voltage (VPP).

The driver 120 may drive the reference word line (DWLRMB) in response to the drive voltage (VPPC), and output the driven reference word line (DWLRMB) signal to the reference word line (DWLRM) of the reference mat (RMAT). The reference word line (DWLRMB) signal may have an inversion level of the reference word line (DWLRM) signal.

Figure 2:
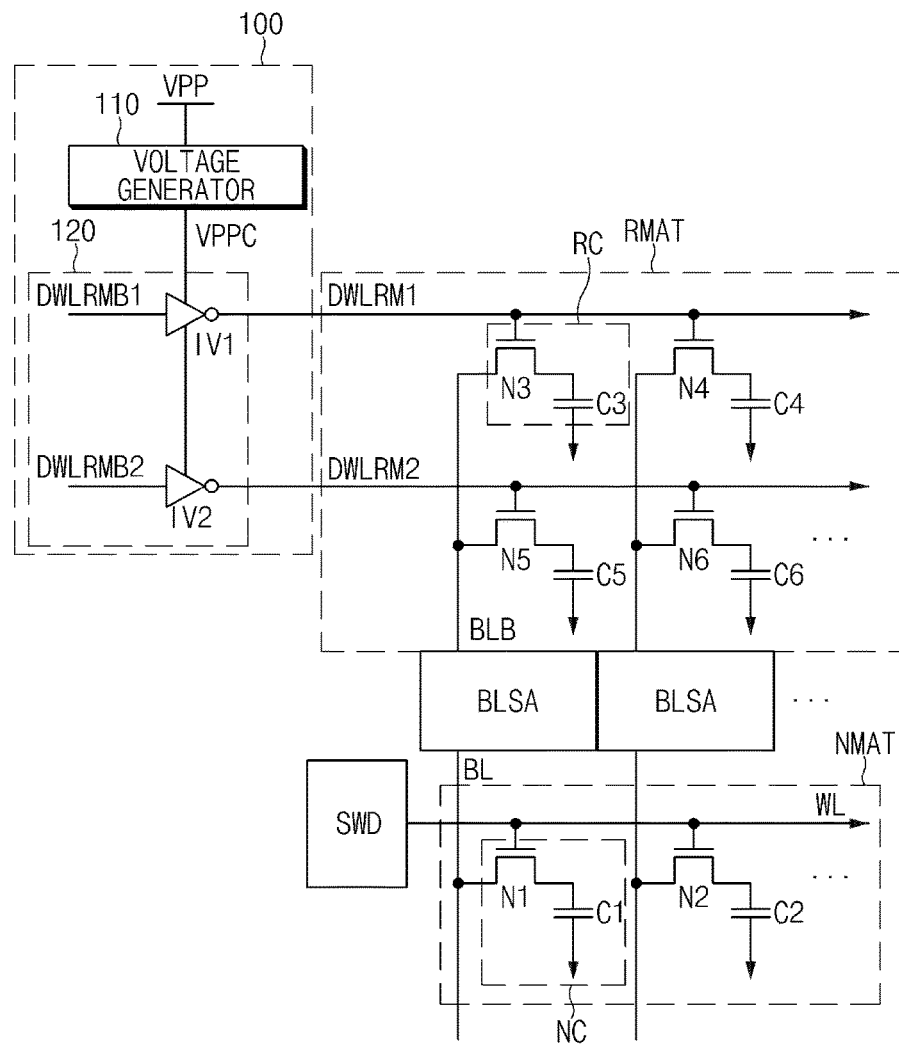
FIG. 2 is a block diagram illustrating a representation of an example of the semiconductor device illustrated in FIG. 1.

FIG. 2 is a block diagram illustrating a representation of an example of the semiconductor device illustrated in FIG. 1.

Referring to FIG. 2, the normal mat (NMAT) may include a plurality of normal cells (NC) configured to store data therein. In this case, the plurality of normal cells (NC) may include a plurality of switching elements (N1, N2) and a plurality of capacitors (C1, C2). The normal cells (NC) may be arranged at intersection regions of the bit line (BL) and the word line (WL).

The switching elements (N1, N2) may be coupled between the bit line (BL) and the capacitors (C1, C2) such that gate terminals thereof are coupled to the word line (WL). In this case, the switching element N1 or N2 may be implemented as an NMOS transistor. The capacitors (C1, C2) may be coupled between a ground voltage terminal and the switching elements (N1, N2).

The normal mat (NMAT) may charge or discharge the capacitors (C1, C2) in response to activation of the switching elements (N1, N2). As a result, the capacitors (C1, C2) may be charged with electric charges (electricity) to store data therein, or charges stored in the capacitors (C1, C2) may be discharged so that the stored data can be erased from the capacitors (C1, C2).

The word line driver (SWD) is coupled to each word line (WL) of the normal mat (NMAT) such that the selected sub-word line can be activated. If the word line (WL) of the normal cell (NC) is activated by the word line driver (SWD), the switching elements (N1, N2) are turned on. As a result, electric charges of the capacitors (C1, C2) can be applied to the sense amplifier (BLSA) through the bit line (BL).

For example, the plurality of sense amplifiers (BLSA) having an open bit line structure may sense a voltage difference between the reference bit line (BLB) of the reference mat (RMAT) and the bit line (BL) of the normal mat (NMAT), may amplify the sensed voltage difference, and may output the amplified voltage difference as an output signal.

The reference mat (RMAT) may include a plurality of reference cells (RC). The plurality of reference cells (RC) may include a plurality of switching elements (N3~N6) and a plurality of capacitors (C3~C6). The plurality of reference cells (RC) may be arranged at intersection regions of the reference bit line (BLB) and the reference word line (DWLRM).

In this case, the plurality of switching elements (N3~N6) may be driven to correct loading of the reference bit line (BLB) contained in the reference mat (RMAT).

The switching elements (N3, N4) may be coupled among the reference bit lines (BLB) and the capacitors (C3, C4) such that gate terminals thereof may be coupled to the reference word line (DWLRM1). In this case, each of the switching elements (N3, N4) may be implemented as an NMOS transistor. The capacitors (C3, C4) may be coupled between the ground voltage terminal and the switching elements (N3, N4).

The switching elements (N5, N6) may be coupled between the reference bit line (BLB) and the capacitors (C5, C6), such that gate terminals thereof may be coupled to the reference word line (DWLRM2). The capacitors (C5, C6) may be coupled between the ground voltage terminal and the switching elements (N5, N6).

The reference mat (RMAT) may charge or discharge the capacitors (C3~C6) in response to activation of the switching elements (N3~N6).

If the reference word line (DWLRM1) of the reference cell (RC) is activated by the driver 120, the switching elements (N3, N4) are turned on. As a result, electric charges stored in the capacitors (C3, C4) may be applied to the sense amplifier (BLSA) through the reference bit line (BLB).

If the reference word line (DWLRM2) of the reference cell (RC) is activated by the driver 120, the switching elements (N5, N6) are turned on. As a result, electric charges stored in the capacitors (C5, C6) may be applied to the sense amplifier (BLSA) through the reference bit line (BLB).

The driver 120 may drive signals of the reference word lines (DWLRM1, DWLRM2) by the drive voltage (VPPC), and may thus change a voltage level and capacitance of the reference bit line (BLB).

The driver 120 may include a plurality of inverters (IV1, IV2). In this case, the inverter (IV1) may inversion-drive the signal of the reference word line (DWLRMB1) in response to the drive voltage (VPPC), and output the inversion-driven result to the reference word line (DWLRM1). The inverter IV2 may inversion-drive the signal of the reference word line (DWLRMB2) in response to the drive voltage (VPPC), and thus output the inversion-driven result to the reference word line (DWLRM2).

The driver 120 may be configured to reduce loading needed to drive the reference word line (DWLRM), may invert the signal of the reference word line (DWLRMB), and may output the inversion result to the reference word line (DWLRM).

In this case, if the inverters (IV1, IV2) of the driver 120 are driven by the high voltage (VPP), loading of the reference word line (DWLRMB) increases. Therefore, if the switching elements (N3~N6) of the reference cell (RC) are overstressed and damaged, reliability of the transistors may be deteriorated.

Therefore, according to an embodiment of the present disclosure, a drive voltage (VPPC) lower than the high voltage (VPP) is applied to the driver 120 through the voltage generator 110, such that loading of the reference word line (DWLRMB) can be reduced. As a result, the switching elements (N3~N6) of the reference cell (RC) may not be overstressed, and this may result in increased reliability of the transistors.

Figure 3:
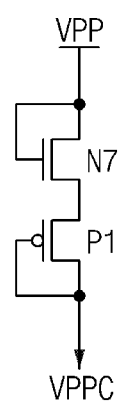
FIGS. 3 to 5 illustrate examples of representations of a voltage generator illustrated in FIG. 2.
Figure 4:
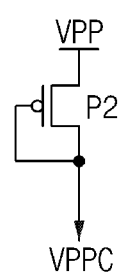
Figure 5:
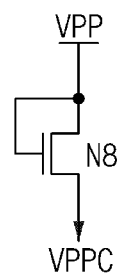

FIGS. 3 to 5 illustrate examples of representations of the voltage generator 110 illustrated in FIG. 2.

Referring to FIG. 3, the voltage generator 110 may include an NMOS diode (N7) and a PMOS diode (P1). The NMOS diode (N7) may be coupled between the PMOS diode (P1) and the high voltage (VPP) input terminal, such that a gate terminal thereof is commonly coupled to the high voltage (VPP) input terminal. The PMOS diode (P1) may be coupled between the NMOS diode (N7) and the drive voltage (VPPC) output terminal, such that a gate terminal thereof is commonly coupled to the drive voltage (VPPC) output terminal.

Referring to FIG. 3, the drive voltage (VPPC) is lower than the high voltage (VPP) not only by a threshold voltage of the NMOS diode (N7) but also by a threshold voltage of the PMOS diode (P1). For example, a transistor threshold voltage (VT) of the NMOS diode (N7) is added to a transistor threshold voltage (VT) of the PMOS diode (P1), such that the drive voltage (VPPC) is output at a voltage level that is lower than the high voltage (VPP) by the added voltage (2VT).

FIG. 4 illustrates a representation of an example in which the voltage generator 110 includes a PMOS diode (P2).

Referring to FIG. 4, the PMOS diode (P2) is coupled between the high voltage (VPP) input terminal and the drive voltage (VPPC) output terminal, such that a gate terminal thereof is commonly coupled to the drive voltage (VPPC) output terminal.

Referring to FIG. 4, the drive voltage (VPPC) is lower than the high voltage (VPP) by a threshold voltage of the PMOS diode (P2). For example, assuming that a transistor threshold voltage of the PMOS diode (P2) is denoted by VT, the drive voltage (VPPC) is output at a voltage level that is lower than the high voltage (VPP) by the threshold voltage (VT).

FIG. 5 illustrates a representation of an example in which the voltage generator 110 includes an NMOS diode (N8).

Referring to FIG. 5, the NMOS diode N8 is coupled between the high voltage (VPP) input terminal and the drive voltage (VPPC) output terminal, such that the gate terminal is commonly coupled to the high voltage (VPP) input terminal.

Referring to FIG. 5, the drive voltage (VPPC) is lower than the high voltage (VPP) by a threshold voltage of the NMOS diode (N8). For example, assuming that a transistor threshold voltage of the NMOS diode (N8) is denoted by VT, the drive voltage (VPPC) is output at a voltage level that is lower than the high voltage (VPP) by the threshold voltage (VT).

Figure 6:
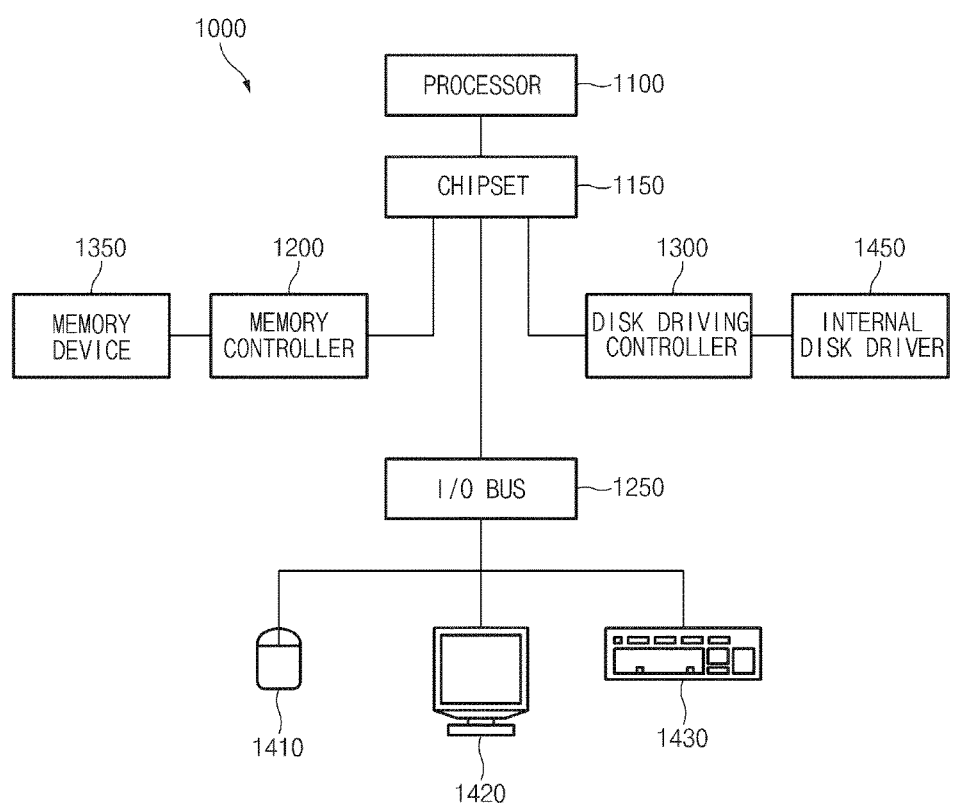
FIG. 6 is a block diagram illustrating a representation of an example of a system including a semiconductor device according to an embodiment of the present disclosure.

FIG. 6 is a block diagram illustrating a representation of an example of a system including a semiconductor device according to an embodiment of the present disclosure.

Referring to FIG. 6, a system 1000 may include one or more processors (i.e. Processor), or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driving controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

The memory controller 1200 may be operably coupled to the chipset 1150. The memory controller 1200 can receive a request provided from the processor (i.e., CPU) 1100 through the chipset 1150. The memory controller 1200 may be operably coupled to one or more memory devices 1350. In an embodiment, the memory devices 1350 may include the impedance calibration (ZQ calibration) circuit discussed above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include, for example, but are not limited to, a mouse 1410, a video display 1420, or a keyboard 1430. The I/O bus 1250 may employ any one of a number of communications protocols to communicate with the I/O devices 1410, 1420 and 1430.

The disk driving controller 1300 may be operably coupled to the chipset 1150. The disk driving controller 1300 may serve as the communication pathway between the chipset 1140 and one internal disk driver 1450 or more than one internal disk driver 1450. The disk driving controller 1300 and the internal disk driver 1450 may communicate with each other or with the chipset 1150 using virtually any type of communication protocol.

Those skilled in the art will appreciate that the present disclosure may be carried out in other specific ways than those set forth herein without departing from the spirit and essential characteristics of the present disclosure. The above embodiments are therefore to be construed in all aspects as illustrative and not restrictive. The scope of the present disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the present disclosure or included as a new claim by a subsequent amendment after the application is filed.

Although a number of illustrative embodiments consistent with the present disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the figures and the accompanying claims. In addition to variations and modifications in the component parts and/or arrangements, alternative uses will also be apparent to those skilled in the art.

What is claimed is:
1. A semiconductor device comprising:
a reference mat including a reference bit line and a reference word line, the reference mat, located adjacent to a normal mat, and the reference mat configured such that a capacitance of the reference bit line is adjusted based on a signal of the reference word line; and
a drive controller configured to drive the signal of the reference word line with a drive voltage based on a boosting voltage, the drive voltage having a lower voltage level than the boosting voltage,
wherein the drive controller includes:
a voltage generator configured to generate the drive voltage at the voltage level lower than the boosting voltage; and
a driver configured to drive the reference word line with the drive voltage,
wherein the drive voltage is applied to the driver through a power supply line of the driver.

2. The semiconductor device according to claim 1, wherein the reference mat includes a plurality of reference cells, each of the reference cells, respectively, formed at an intersection region of the reference word line and the reference bit line.

3. The semiconductor device according to claim 2, wherein each of the plurality of reference cells includes:
a switching element activated by the reference word line, and configured to include one terminal thereof coupled to the reference bit line; and
a capacitor coupled to another terminal of the switching element.

4. The semiconductor device according to claim 3, wherein the switching element includes an NMOS transistor.

5. The semiconductor device according to claim 1, wherein the driver includes a plurality of inverters driven by the drive voltage.

6. The semiconductor device according to claim 1, wherein the voltage generator outputs a voltage level that is lower than a threshold voltage of a diode coupled in series between an input terminal of the boosting voltage and an output terminal of the drive voltage, as the drive voltage.

7. The semiconductor device according to claim 1, wherein the voltage generator includes:
an NMOS diode and a PMOS diode coupled in series between an input terminal of the boosting voltage and an output terminal of the drive voltage,
wherein a gate terminal of the NMOS diode is commonly coupled to the boosting voltage input terminal, and a gate terminal of the PMOS diode is commonly coupled to the drive voltage output terminal.

8. The semiconductor device according to claim 1, wherein the voltage generator includes:
a PMOS diode coupled between an input terminal of the boosting voltage and an output terminal of the drive voltage such that a gate terminal of the PMOS diode is commonly coupled to the drive voltage output terminal.

9. The semiconductor device according to claim 1, wherein the voltage generator includes:
an NMOS diode coupled between an input terminal of the boosting voltage and an output terminal of the drive voltage such that a gate terminal of the NMOS diode is commonly coupled to the boosting voltage input terminal.

10. A semiconductor device comprising:
a normal mat configured to include a plurality of normal cells formed at an intersection region of a word line and a bit line;

a reference mat including a reference bit line and a reference word line, the reference mat, located adjacent to the normal mat, and the reference mat configured such that a capacitance of the reference bit line is adjusted based on a signal of the reference word line;

a sense amplifier configured to sense and amplify signals of the bit line and the reference bit line; and a drive controller configured to drive the signal of the reference word line with a drive voltage based on a boosting voltage, the drive voltage having a lower voltage level than the boosting voltage, wherein the drive controller includes:

a voltage generator configured to generate the drive voltage at the voltage level lower than the boosting voltage; and a driver configured to drive the reference word line with the drive voltage, wherein the drive voltage is applied to the driver through a power supply line of the driver.

11. The semiconductor device according to claim 10, wherein the reference mat includes a plurality of reference cells, each of the reference cells, respectively, formed at an intersection region of the reference word line and the reference bit line.

12. The semiconductor device according to claim 11, wherein each of the plurality of reference cells includes:

a switching element activated by the reference word line, and configured to include one terminal thereof coupled to the reference bit line; and a capacitor coupled to another terminal of the switching element.

13. The semiconductor device according to claim 12, wherein the switching element includes an NMOS transistor.

14. The semiconductor device according to claim 10, wherein the driver includes a plurality of inverters driven by the drive voltage.

15. The semiconductor device according to claim 10, wherein the voltage generator outputs a voltage level that is lower than a threshold voltage of a diode coupled in series between an input terminal of the boosting voltage and an output terminal of the drive voltage, as the drive voltage.

16. The semiconductor device according to claim 10, wherein the voltage generator includes:

an NMOS diode and a PMOS diode coupled in series between an input terminal of the boosting voltage and an output terminal of the drive voltage, wherein a gate terminal of the NMOS diode is commonly coupled to the boosting voltage input terminal, and a gate terminal of the PMOS diode is commonly coupled to the drive voltage output terminal.

17. The semiconductor device according to claim 10, wherein the voltage generator includes:

a PMOS diode coupled between an input terminal of the boosting voltage and an output terminal of the drive voltage such that a gate terminal of the PMOS diode is commonly coupled to the drive voltage output terminal.

18. The semiconductor device according to claim 10, wherein the voltage generator includes:

an NMOS diode coupled between an input terminal of the boosting voltage and an output terminal of the drive voltage such that a gate terminal of the NMOS diode is commonly coupled to the boosting voltage input terminal.

\* \* \* \* \*